(12) United States Patent
Yamamoto et al.

(10) Patent No.: US 6,661,697 B2
(45) Date of Patent: Dec. 9, 2003

(54) DATA READ-OUT CIRCUIT, DATA READ-OUT METHOD, AND DATA STORAGE DEVICE

(75) Inventors: Akira Yamamoto, Kawasaki (JP); Shoichiro Kawashima, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/272,997

(22) Filed: Oct. 18, 2002

(65) Prior Publication Data

US 2003/0031042 A1 Feb. 13, 2003

Related U.S. Application Data

(62) Division of application No. 09/812,699, filed on Mar. 21, 2001, now Pat. No. 6,487,103.

(30) Foreign Application Priority Data

Oct. 31, 2000 (JP) ......................................... 2000-333160

(51) Int. Cl.$^7$ .............................................. G11C 11/22
(52) U.S. Cl. .................. 365/145; 365/189.09
(58) Field of Search ........................... 365/145, 189.09, 365/189.05, 189.12, 213

(56) References Cited

U.S. PATENT DOCUMENTS

| | | | |
|---|---|---|---|
| 5,530,670 A | 6/1996 | Matsumoto | 365/189.05 |
| 5,815,444 A | 9/1998 | Ohta | 365/189.05 |
| 5,969,979 A | * 10/1999 | Hirano | 365/145 |
| 6,058,049 A | * 5/2000 | Kye et al. | 365/189.09 |
| 6,208,550 B1 | * 3/2001 | Kim | 365/145 |

* cited by examiner

*Primary Examiner*—Anh Phung
(74) *Attorney, Agent, or Firm*—Arent Fox Kintner Plotkin & Kahn, PLLC

(57) ABSTRACT

The present invention provides a data storage device that has high reliability and less power consumption, and a data read-out circuit and a data read-out method employed in the data storage device. This data storage device of the present invention includes a bit line and a memory cell (a ferroelectric capacitor) connected to the bit line. This data storage device characteristically further includes: a capacitor that accumulates electric charge supplied; a negative voltage generating circuit, a p-channel MOS transistor T2, a Vth generating circuit 11, and a feedback circuit 13 that transfer electric charge outputted onto the bit line BL at the time of data read-out to the capacitor; and a sense amplifier circuit 5 that amplifies a voltage generated by the electric charge accumulated by the capacitor, so as to read out the data from the memory cell.

4 Claims, 5 Drawing Sheets

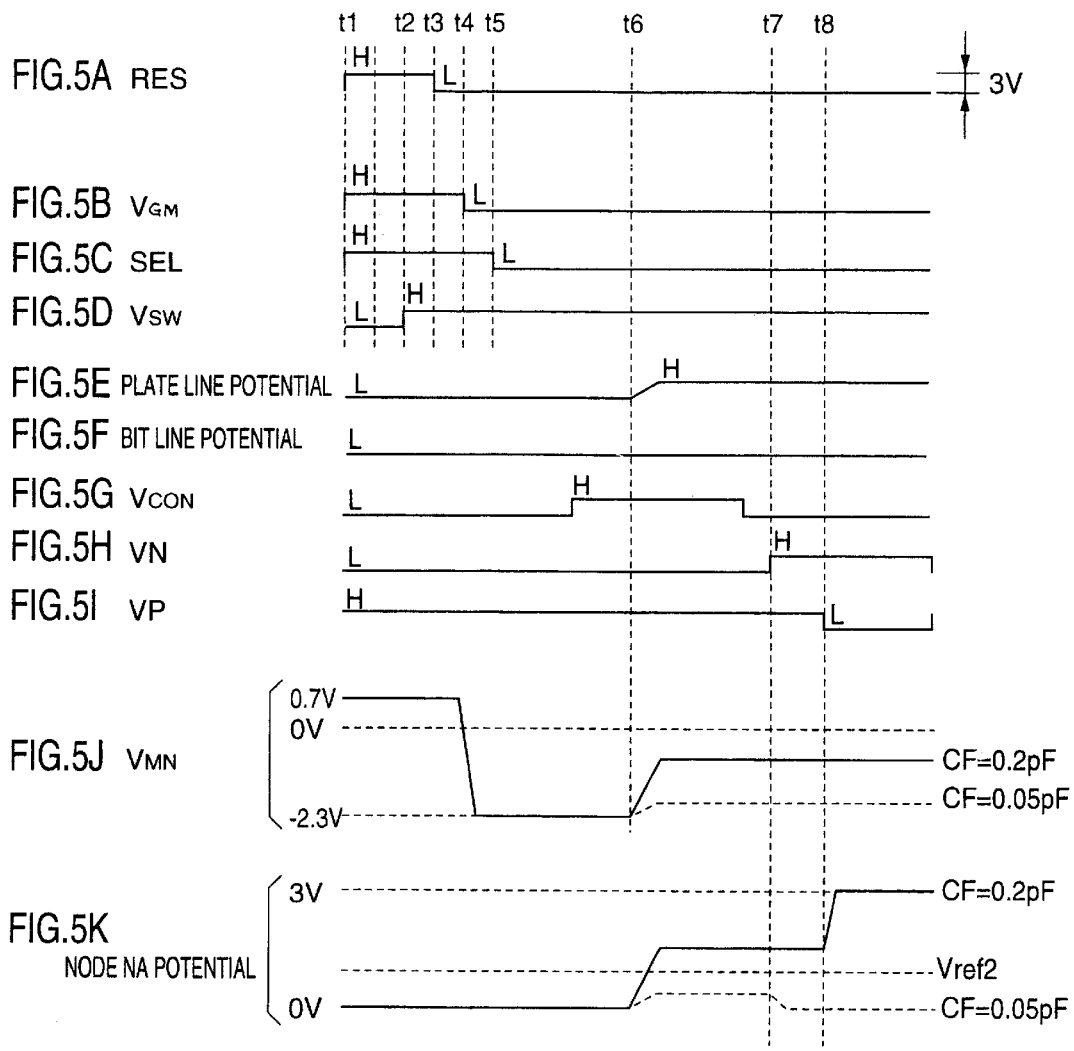

DATA READ-OUT CIRCUIT, DATA READ-OUT METHOD, AND DATA STORAGE DEVICE

This application is a divisional application filed under 37 CFR §1.53(b) of parent application Ser. No. 09/812,699, filed Mar. 21, 2001, now U.S. Pat. No. 6,487,103 issued on Nov. 26, 2002. The disclosure of the prior application is hereby incorporated by reference herein in its entirety.

BACKGROUND OF THE INVENTION

1. Field of the Invention

The present invention relates to a data readout circuit, a data readout method, and a data storage device.

2. Description of the Related Art

FIG. 1 is a circuit diagram showing the structure of a conventional ferroelectric memory. As shown in FIG. 1, the conventional ferroelectric memory comprises a word line WL, a bit line BL, a ferroelectric capacitor CF, n-channel MOS transistors 12, 14, 17A, 17B, 18A, 18B, and T1, p-channel MOS transistors T8 to T10, capacitors 19 and 22, and nodes NA and NB. The bit line BL has a bit line stray capacitance $C_{BL}$.

Here, the gate of the n-channel MOS transistor 14 is connected to the word line WL. One terminal of the source/drain of the n-channel MOS transistor 14 is connected to the bit line BL, while the other terminal is connected to the ferroelectric capacitor CF. A plate line CP is connected to one terminal of the ferroelectric capacitor CF.

A voltage $V_{CON}$ is supplied to the n-channel MOS transistors 17A and 17B, while a reference voltage $V_{ref}$ is supplied to the source/drain of the n-channel MOS transistor 17A. A voltage VN is supplied to the gate of the n-channel MOS transistor 12, and a voltage RES is supplied to the gate of the n-channel MOS transistor T1. A voltage VP is supplied to the gate of the p-channel MOS transistor T8.

In the above ferroelectric memory, the single n-channel MOS transistor 14 and the single ferroelectric capacitor CF constitute one ferroelectric memory cell, as shown in FIG. 1. This ferroelectric capacitor CF holds digital information consisting of 1 or 0 in a non-volatile state by taking a reverse polarized state.

Next, an operation to write the data in the ferroelectric memory cell will be described. When the information of "1" is written in the ferroelectric memory cell, the potential of the bit line BL serves as a ground potential. When the information of "0" is written in the ferroelectric memory cell, the potential of the bit line BL serves as a power potential Vcc. The word line WL is then activated, so that the n-channel MOS transistor 14 is energized and that the potential of the plate line CP changes from the ground potential to the power source potential Vcc and returns to the ground potential. Receiving the voltage, the ferroelectric capacitor CF shifts to a predetermined polarized state, and holds the information of "1" or "0". When the data write operation is completed, the potential of the bit line BL is returned to the ground potential.

Next, an operation to read out data from the ferroelectric memory cell will be described. In this case, the potential of the bit line BL serves as the ground potential. The word line WL is activated, so that the n-channel MOS transistor 14 is energized, and that the potential of the plate line CP shifts from the ground potential to the power source potential Vcc, thereby moving the charges polarized to the ferroelectric capacitor CF to the bit line BL. Here, the potential of the bit line BL greatly or slightly rises depending on the polarized state of the ferroelectric capacitor CF.

For instance, a latched sense amplifier circuit compares the potential of the bit line BL with the reference potential. In the initial state, the power source to the sense amplifier circuit is off, and when voltage is applied to the two input terminals, the power is supplied to the sense amplifier circuit. At this point, the input terminal having the potential higher than the other rises to the power source potential Vcc, and the input terminal having the potential lower than the other drops to the ground potential. By this sense amplifier circuit, data held by the ferroelectric capacitor CF can be read out.

FIGS. 2A to 2I are timing charts showing the data read-out operation performed by the conventional ferroelectric memory shown in FIG. 1. As shown in FIGS. 2A and 2B, a voltage $V_{CON}$ and a signal RES are activated from 0 V (low level) to 3 V (high level) at time t1. By doing so, the potential of the bit line BL is initialized to 0 V, as shown in FIG. 2G. As shown in FIG. 2A, the voltage $V_{CON}$ is high until time t4.

As shown in FIG. 2C, the word line WL is activated at time t2, and the n-channel MOS transistor 14 is switched on. As shown in FIG. 2D, the potential of the plate line CP rises from 0 V to the power source potential (3 V) at time t3. Here, the potential of the bit line BL rises depending on the polarized charge amount of the ferroelectric capacitor CF, as shown in FIG. 2G.

In FIGS. 2G to 2I, each converted capacitance value, 0.2 pF, of the ferroelectric capacitor CF is indicated by a solid line, while each converted capacitance value, 0.05 pF, is indicated by a broken line. As can be seen from the timing charts, the larger the polarized charge amount, the higher the potential of the bit line BL. When the converted capacitance value of the ferroelectric capacitor CF is 0.2 pF, the potential of the bit line BL rises up to 0.5 V, which will be described more later.

Next, as shown in FIG. 2E, the voltage VN to be supplied to the gate of the n-channel MOS transistor 12 that serves as a power switch for a sense amplifier is shifted to the high level at time t5. Here, as shown in FIGS. 2H and 2I, if the potential of the node NA (the potential of the bit line BL) is lower than the potential of the node NB (the reference voltage $V_{ref}$), the potential of the node NA becomes 0 V while the potential of the node NB becomes equal to the reference voltage $V_{ref}$, as indicated by the broken lines. On the other hand, the potential of the node NA is higher than the potential of the node NB, the potential of the node NA does not fluctuate, but the potential of the node NB shifts to 0 V, as indicated by the solid lines.

Next, as shown in FIG. 2F, a voltage VP to be supplied to the gate of the p-channel MOS transistor T8 that serves as a VCC power switch for a sense amplifier is shifted to the low level at time t6. As shown in FIGS. 2H and 2I, if the potential of the node NA is lower than the potential of the node NB, the potential of the node NA is 0 V while the potential of the node NB becomes 3 V, as indicated by the broken lines. On the other hand, if the potential of the node NA is higher than the potential of the mode NB, the potential of the node NA becomes 3V while the potential of the node NB remains 0 V, as indicated by the solid lines.

As described above, after one of the potentials of the node NA and the node NB is shifted to 0 V while the other one of the potentials is shifted to 3 V, the potential of the node NA is transmitted via the bit line BL, so that the information stored in the ferroelectric memory cell is read out.

In the process of reading out information from the conventional ferroelectric memory shown in FIG. 1, the potential of the bit line rises depending on the polarization of the ferroelectric capacitor. Assuming that a cell capacitance value determined from the polarized charge amount of the ferroelectric capacitor and the voltage supplied between the electrodes is about 0.2 pF, the parasitic capacitance of the bit line is 1 pF, and the power source voltage is 3 V, the voltage of the bit line rises, by 0.5 V, which is calculated by 3 V×0.2 pF/(0.2 pF+1 pF), when the plate line rises from 0 V to 3 V. The potential of the bit line is shown in FIG. 2G. Accordingly, the voltage to be supplied to the ferroelectric capacitor becomes 2.5 V, which is calculated by 3 V−0.5 V.

Intensive studies have been made on lowering the read-out voltage of the properties of the ferroelectric capacitor. However, polarized electric charge cannot adequately read out with a low read-out voltage, which results in inaccurate information read-out and reduction of read-out margins.

Meanwhile, to reduce the power consumption of portable telephones and mobile electronic equipment, there has been a strong demand for lowering the power source voltage as well. If the bit line capacitance is increased, a rise of the voltage of the bit line can be reduced and a larger voltage difference can be applied across a ferroelectric capacitor. However, a read-out signal becomes smaller at the same time. As a result, in a latch-type sense amplifier circuit in a ferroelectric memory, a wrong operation is often caused due to an error in the input offset voltage.

Therefore, it is necessary to design the latch-type sense amplifier circuit, so that a rise of the voltage of the bit line can be restricted to about 0.5 V. However, when the power source voltage drops to 2 V or 1 V, it is difficult to supply sufficient voltage across the ferroelectric capacitor.

SUMMARY OF THE INVENTION

A general object of the present invention is to provide data storage devices in which the above disadvantages are eliminated.

A more specific object of the present invention is to provide a data storage device that has high reliability and less power consumption, and a data read-out circuit and a data read-out method employed in the data storage device.

The above objects of the present invention are achieved by a data storage device that comprises: a memory cell connected between a plate line and a bit line; and a potential holding unit that maintains a potential of the bit line at a predetermined potential so as to prevent a fluctuation of the potential of the bit line even when a voltage is supplied to the plate line.

With this data storage device, the electric charge accumulated in the memory cell can be read out without fail.

The above objects of the present invention are also achieved by a data read-out circuit that reads out data from a memory cell, comprising: a charge accumulating unit that accumulates electric charge supplied; a charge transfer unit that transfers the electric charge accumulated in the memory cell to the charge accumulating unit in accordance with the data; and an amplifier unit that amplifies a voltage generated by the electric charge accumulated in the charge accumulating unit, and reads out the data from the memory cell.

The above objects of the present invention are also achieved by a data storage device that comprises: a bit line; a memory cell that is connected to the bit line; a charge accumulating unit that accumulates electric charge supplied; a charge transfer unit that transfers electric charge to the charge accumulating unit, the electric charge being accumulated in the memory cell based on stored data and then outputted onto the bit line at the time of reading out the data; and an amplifier unit that amplifies a voltage generated by the electric charge accumulated in the charge accumulating unit, and reads out data from the memory cell.

With this data storage device, data can be read out without fail, in accordance with the electric charge accumulated in the memory cell and outputted onto the bit line.

The above objects of the present invention are also achieved by a method of reading out data from a memory cell, comprising the steps of: transferring electric charge accumulated in the memory cell to a charge accumulating unit in accordance with the data; and amplifying a voltage generated by the electric charge accumulated in the charge accumulating unit, so as to reading the data from the memory cell.

The above and other objects and features of the present invention will become more apparent from the following description taken in conjunction with the accompanying drawings.

BRIEF DESCRIPTION OF THE DRAWINGS

FIGS. 5A to 5K are timing charts illustrating operations performed by the ferroelectric memory shown in FIG. 4.

DESCRIPTION OF THE PREFERRED EMBODIMENTS

Figure 1:
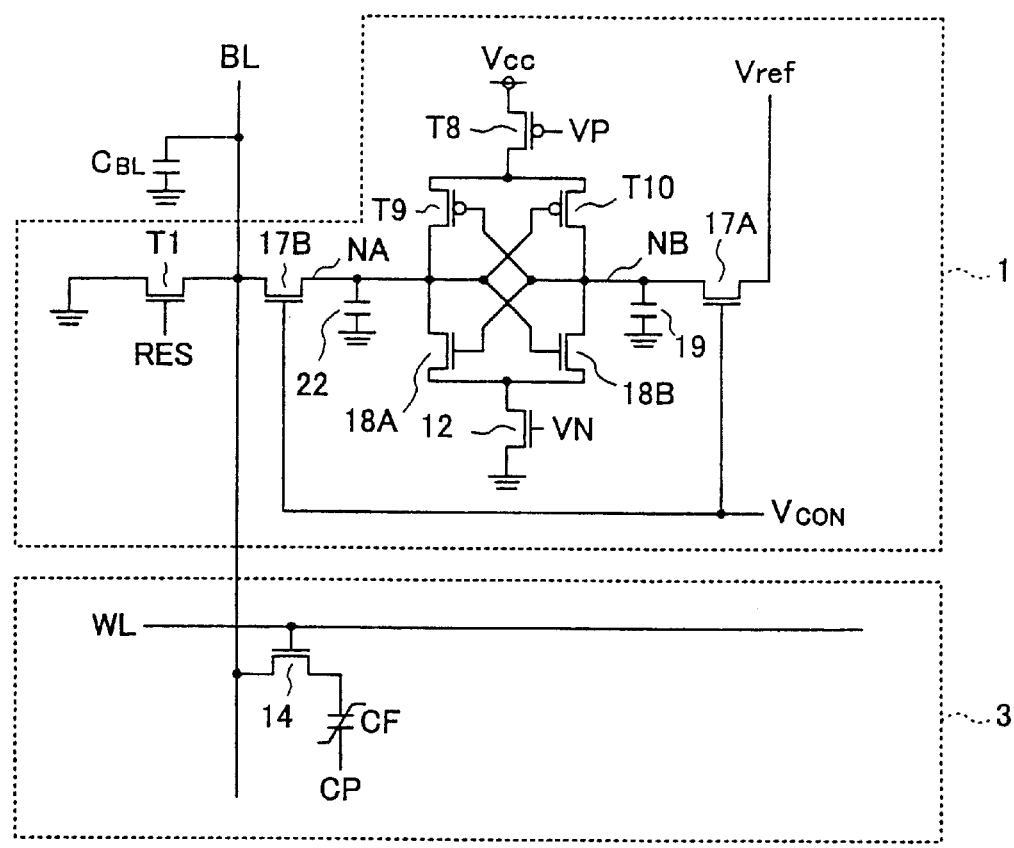
FIG. 1 is a circuit diagram showing the structure of a conventional ferroelectric memory.
Figure 2:
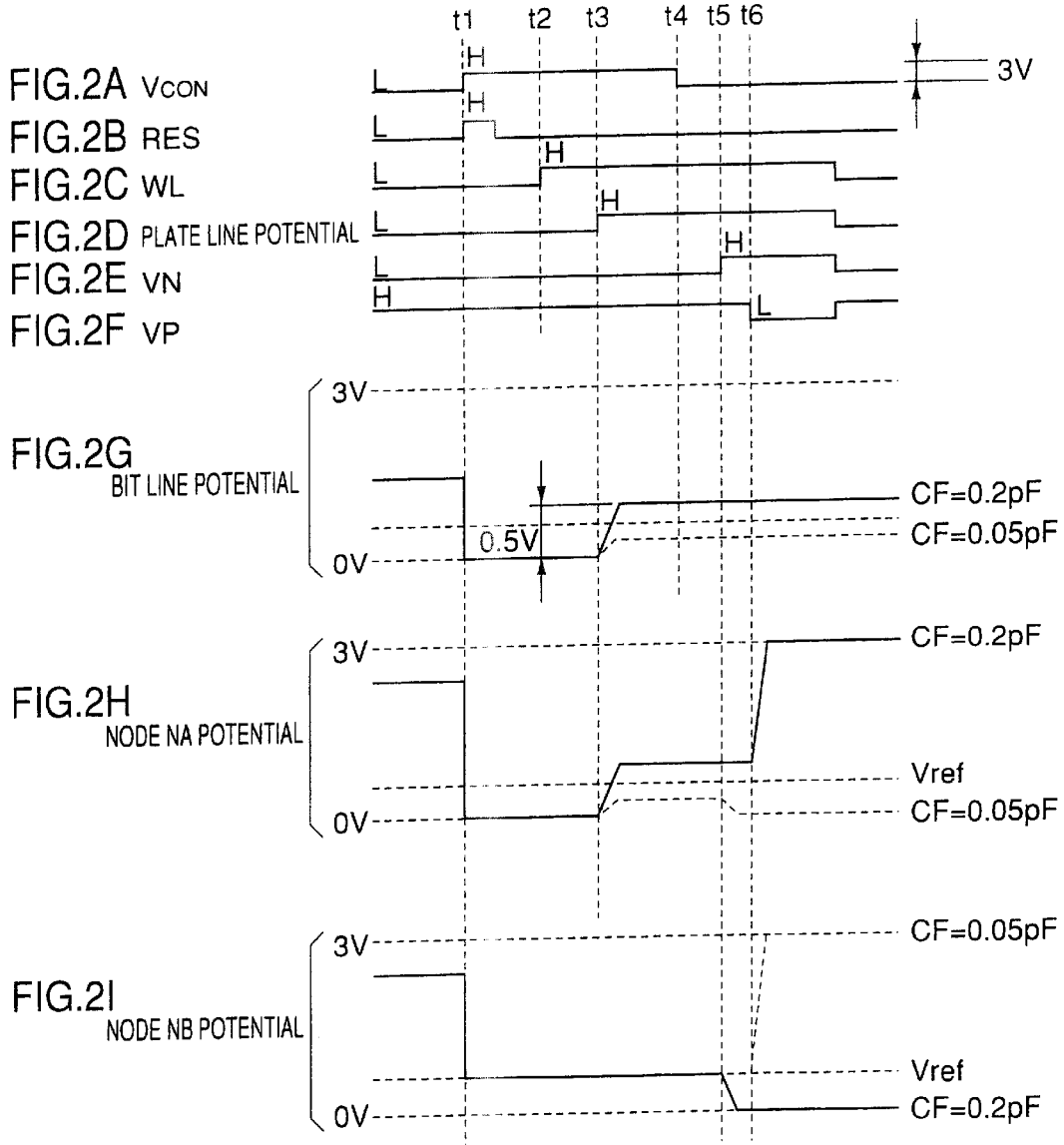
FIGS. 2A to 2I are timing charts illustrating a data read-out operation performed by the ferroelectric memory shown in FIG. 1.

The following is a description of embodiments of the present invention, with reference to the accompanying drawings. In the drawings, like components are denoted by like reference numerals.

In the ferroelectric memory of the present invention, the maximum voltage supplied across the ferroelectric capacitor included in the ferroelectric memory is set at 3 V, which is the same as the power voltage, so that the voltage of the plate line is prevented from rising above the Vcc potential. The voltage of the bit line is prevented from rising above the ground potential, so that the maximum voltage applied across the ferroelectric capacitor is set at 3 V. While the potential of the bit line remains to be the ground potential, the amount of electric charge that has flown from the ferroelectric capacitor to the bit line is measured.

Figure 3:
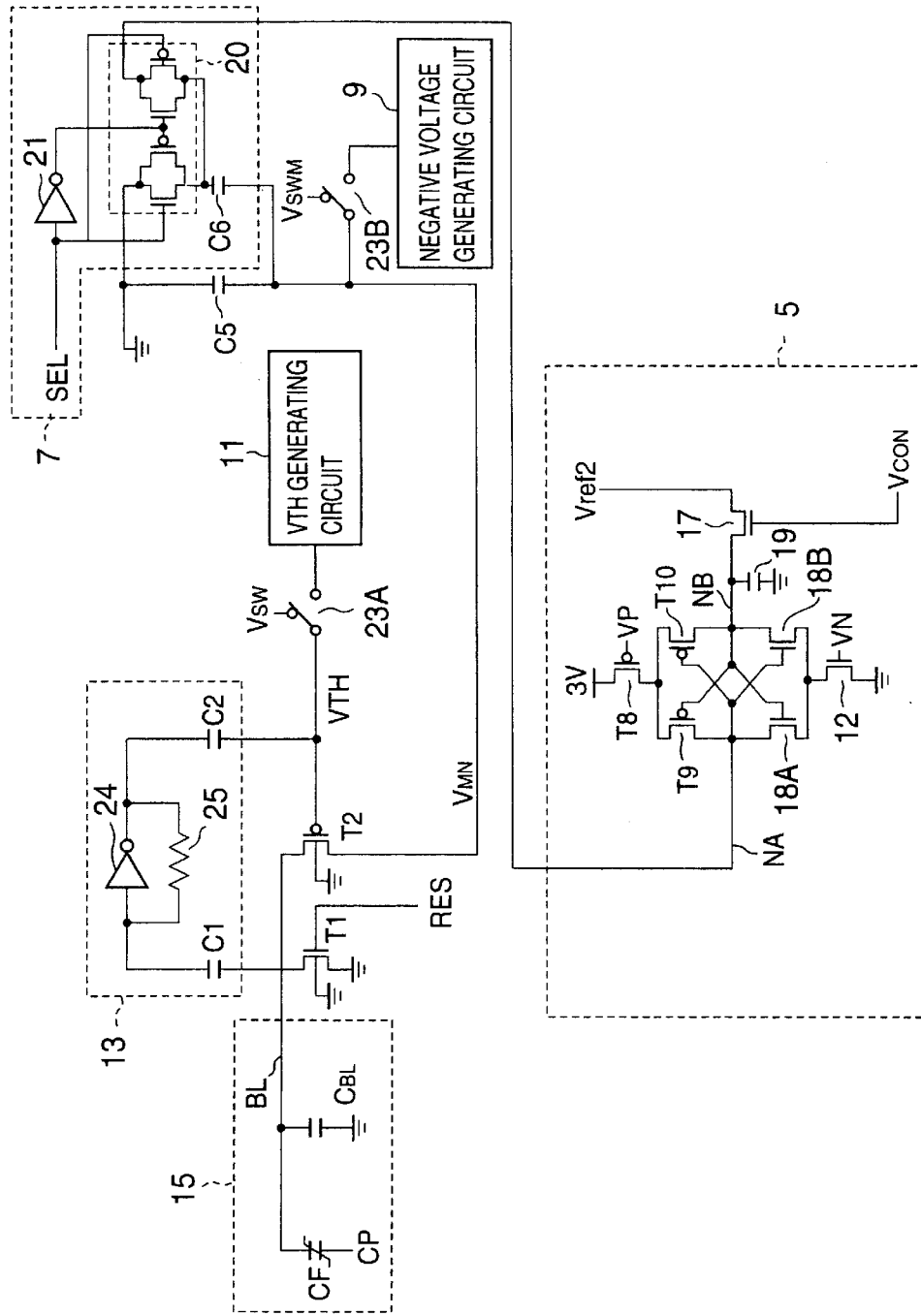
FIG. 3 is a circuit diagram showing the structure of a ferroelectric memory in accordance with the present invention.

FIG. 3 is a circuit diagram showing the structure of the ferroelectric memory of this embodiment. As shown in FIG. 3, the ferroelectric memory of this embodiment comprises a sense amplifier circuit 5, a voltage shift circuit 7, a negative voltage generating circuit 9, a Vth generating circuit 11, a feedback circuit 13, a memory cell region 15, an n-channel MOS transistor T1, a p-channel MOS transistor T2, a capacitor C5, and switches 23A and 23B.

The sense amplifier circuit 5 comprises n-channel MOS transistors 12, 17, 18A, and 18B, p-channel MOS transistors T8 to T10, a capacitor 19, and nodes NA and NB. The voltage shift circuit 7 comprises a gate circuit 20, an inversion circuit 21, and a capacitor C6. The feedback circuit 13 comprises capacitors C1 and C2, an inversion circuit 24, and a resistance element 25. The memory cell region 15 includes a bit line BL, a bit line stray capacitance $C_{BL}$, a ferroelectric capacitor CF, and a plate line CP. The bit line capacitance $C_{BL}$ indicates the parasitic capacitance of bit line BL represented as an equivalent circuit in the circuit diagram.

The capacitor C6 included in the voltage shift circuit 7 is connected in parallel with the capacitor C5, and the output node of the voltage shift circuit 7 is connected to the node NA of the sense amplifier circuit 5. The negative voltage generating circuit 9 generates a negative voltage $V_{MN}$, and supplies it to the capacitor C5 via the switch 23B.

The Vth generating circuit 11 generates a threshold value voltage VTH, and supplies it to the gate of the p-channel MOS transistor T2 via the switch 23A. The feedback circuit 13 is connected between the bit line BL and the gate of the p-channel MOS transistor T2.

The switch 23A is controlled in accordance with a supplied voltage $V_{SW}$, and the switch 23B is controlled in accordance with a supplied voltage $V_{SWM}$. A voltage $V_{CON}$ is supplied to the gate of the n-channel MOS transistor 17 included in the sense amplifier circuit 5, and a reference voltage Vref2 is supplied to the source/drain of the n-channel MOS transistor 17.

Figure 4:
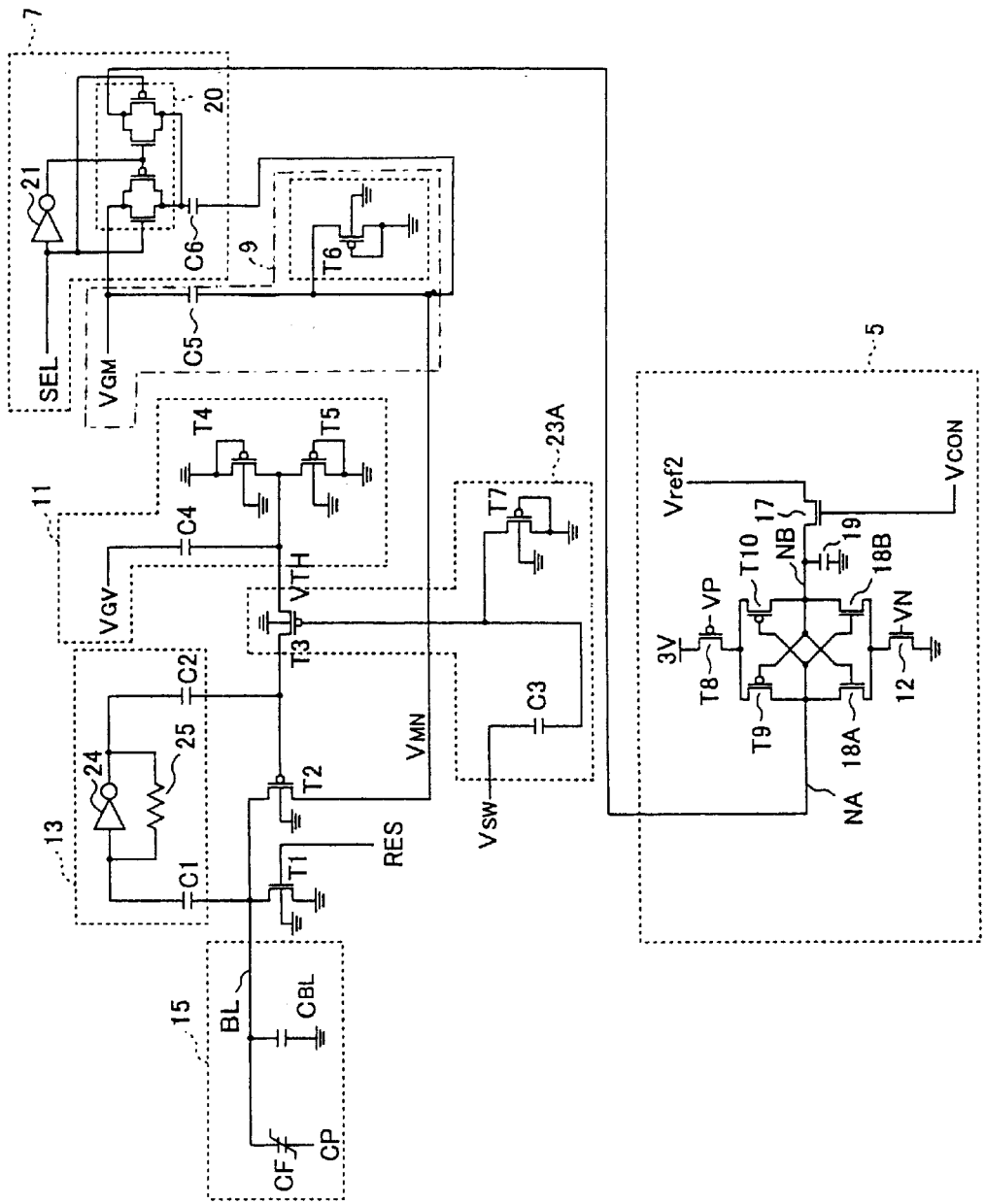
FIG. 4 is a circuit diagram showing a more specific example of the ferroelectric memory of FIG. 3.

FIG. 4 is a more detailed view of the ferroelectric memory shown in FIG. 3. As shown in FIG. 4, the negative voltage generating circuit 9 is formed by a diode-connected p-channel MOS transistor T6 and the coupling capacitor C5. A voltage pulse $V_{GM}$ is supplied to one of the electrodes connecting the capacitor C5. The Vth voltage generating circuit 11 comprises a capacitor C4, and diode-connected p-channel MOS transistors T4 and T5. A voltage pulse $V_{GV}$ is supplied to one of the electrodes constituting the capacitor C4.

The switch 23A is made up of a capacitor C3, a p-channel MOS transistor T3, and a diode-connected p-channel MOS transistor T7. The voltage $V_{SW}$ is supplied to one of the electrodes that constitute the capacitor C3.

As shown in FIG. 4, a voltage VGM, instead of the ground voltage, may be supplied to one of the electrodes constituting the capacitor C5 and the gate circuit 20.

As described so far, in the ferroelectric memory of this embodiment, the negative voltage to be used is generated by a p-channel MOS transistor and capacitor, thereby eliminating the need for a negative power source. The N-well back gate potential of a p-channel MOS transistor is generally at the power voltage level. However, the N-well back gate potential of a p-channel MOS transistor using a negative voltage is set at 0 V so that a low voltage resistant transistor can be used.

In the following, an operation performed by the ferroelectric memory of this embodiment will be described, referring to the timing charts shown in FIGS. 5A to 5K.

As shown in FIG. 5A, when a signal RES supplied to the gate of the n-channel MOS transistor T1 is activated at the high level at time t1, the potential of the bit line BL shown in FIG. 5F is initialized to the ground potential. Meanwhile, the voltage $V_{SW}$ is low during the period between time t1 and time t2, as shown in FIG. 5D, thereby switching on the switch 23A. The threshold value voltage VTH is then supplied to the gate of the p-channel MOS transistor T2 by switching $V_{GV}$ from high to low.

In the Vth generating circuit 11 shown in FIG. 4, the diode-connected p-channel MOS transistor T5 serves as a clamp circuit of +0.7 V and also charges the capacitor C4. Accordingly, with the voltage $V_{GV}$ being 3 V, the capacitor C4 is charged by about 2.3 V. Meanwhile, the diode-connected p-channel MOS transistor T4 also causes a drop in the voltage by about 0.7 V, and serves as a clamp circuit of −0.7 V and to prevent the voltage VTH from dropping below −0.7 V. Accordingly, with the voltage $V_{GV}$ being 0 V, the voltage VTH is about −0.7 V.

Here, since the voltage VTH is substantially equal to the threshold voltage VTH of the p-channel MOS transistor T2, the p-channel MOS transistor T2 is placed in a mid-state between a non-energized state (OFF state) and an energized state (ON state). If the gate voltage drops from this mid-level or the source voltage rises, the p-channel MOS transistor T2 shifts to the ON state. If the gate voltage rises from this mid-level or the source voltage drops, the p-channel MOS transistor T2 shifts to the OFF state. After the gate voltage of the p-channel MOS transistor T2 is set, the p-channel MOS transistor T3 is switched off at time t2.

Meanwhile, a voltage corresponding to the voltage $V_{SW}$ is supplied to the gate of the p-channel MOS transistor T3. Here, the diode-connected p-channel MOS transistor T7 causes a 0.7 V drop in the voltage, and serves as a clamp circuit of +0.7 V. Accordingly, when the voltage $V_{SW}$ is set at 3 V, a voltage of +0.7 V is supplied to the gate of the p-channel MOS transistor T3, thereby putting the p-channel MOS transistor T3 into the OFF state. At the same time the capacitor C3 is charged with 2.3 V. When the voltage $V_{SW}$ is set at 0 V, a voltage of −2.3 V is supplied to the gate of the p-channel MOS transistor T3, thereby putting the p-channel MOS transistor T3 into the ON state.

As shown in FIG. 5A, the signal RES is inactivated and shifted to the low level at time t3, thereby switching off the n-channel MOS transistor T1. Next, as shown in FIG. 5B, the voltage $V_{GM}$ decreases to the low level at time t4. By doing so, a negative voltage generated from the negative voltage generating circuit 9 operates, and the voltage $V_{MN}$ becomes about −2.3 V, as shown in FIG. 5J.

In the embodiment shown in FIG. 4, the p-channel MOS transistor T6, the capacitors C5 and C6, and the voltage $V_{GM}$ are controlled so as to make the voltage $V_{MN}$ negative. More specifically, a signal SEL is first shifted to the high level, thereby connecting the capacitors C5 and C6 in parallel. Next, the diode-connected p-channel MOS transistor T6 causes a 0.7 V drop in the voltage and serves as a clamp circuit of +0.7 V. Accordingly, when the voltage $V_{GM}$ is set at 3 V, the capacitors C5 and C6 are charged at about 2.3 V. When the voltage $V_{GM}$ is next set at 0 V, the voltage $V_{MN}$ becomes −2.3 V.

The voltage shift circuit 7 shown in FIG. 3 is a circuit that outputs a voltage that is obtained by shifting the voltage $V_{MN}$ by about 2.3 V in the positive direction. The voltage $V_{MN}$ is a negative voltage, and a circuit using a negative voltage generally causes problems in design and power consumption. Therefore, the voltage $V_{MN}$ is shifted to a positive voltage region, so that the latch-type sense amplifier circuit 5 connected to the next stage can be used in a positive voltage.

As shown in FIG. 5C, the signal SEL is high during the period between time t1 and time t5, and one of the electrodes of the capacitor C6 is grounded. After time t5, the signal SEL decreases to the low level the one of the electrodes of the capacitor C6 is connected to the node NA of the sense amplifier circuit 5. Here, the potential of the node NA becomes higher than the voltage $V_{MN}$ by about 2.3 V.

As shown in FIG. 5C, when the potential of the plate line CP rises from the ground potential to the power source voltage potential Vcc at time t6, the ferroelectric capacitor CF releases electric charge toward the bit line BL. As a result, the potential of the bit line BL rises, and the p-channel MOS transistor T2 is switched on, allowing current to flow through the source and drain. Thus, the electric charge on the bit line BL flows into a portion having the negative voltage $V_{MN}$.

Accordingly, while the voltage $V_{MN}$ rises at time t6 as shown in FIG. 5J, the potential of the bit line BL is maintained at the low level as show in FIG. 5F. The stability of the voltage of the bit line BL means that the bit line BL is in a low impedance state.

A circuit that transfers the electric charge read out onto the bit line BL to the portion having the negative voltage $V_{MN}$ via the p-channel MOS transistor T2 may be called a charge transfer circuit.

The voltage $V_{MN}$ is a voltage to be supplied between the two electrodes of the capacitor C5. The electric charge accumulated in the ferroelectric capacitor CF is finally transferred to the capacitor C5, thereby preventing a rise of the potential of the bit line BL. Thus, the voltage of the capacitor C5 varies with the polarized charge amount of the ferroelectric capacitor CF.

Since the voltage of the capacitor C5 is connected to the node NA of the sense amplifier circuit 5 via the capacitor C6, the potential of the node NA rises by the same amount as the voltage $V_{MN}$ at time t6. Further, the reference voltage Vref2 to be supplied to the sense amplifier circuit 5 should be suitably selected so that the polarized state of the ferroelectric capacitor CF.

As shown in FIG. 5G, the voltage $V_{CON}$ to be supplied to the gate of the n-channel MOS transistor 17 is activated at the high level during a predetermined period of time around time t6, thereby switching on the n-channel MOS transistor 17 and supplying the reference voltage Vref2 to the node NB.

As shown in FIGS. 5H and 5I, the voltage VN to be supplied to the gate of the n-channel MOS transistor 12 is activated at the high level at time t7, and the voltage VP to be supplied to the gate of the p-channel MOS transistor T8 is activated at the low level at time t8. If the potential of the node NA is higher than the potential of the node NB (i.e., the reference voltage Vref2), the potential of the node NA rises to the power source voltage level (3 V). If the potential of the node NA is lower than the potential of the node NB (i.e., the reference voltage Vref2), the potential of the node NA drops to the ground voltage level (0 V), as indicated by the broken line shown in FIG. 5K.

As described so far, in the ferroelectric memory of this embodiment, the potential of the node NA at time t8 and after is checked so as to read out the polarized state of the ferroelectric capacitor CF (the data stored in the ferroelectric memory cell) can be read out without allowing the potential of the bit line BL to become higher than the ground potential.

Also, in the ferroelectric memory of this embodiment, a negative voltage is supplied to one of the electrodes of the capacitor C5, and the electric charge generated on the bit line BL at the time of the data read-out operation is directed toward the capacitor C5. By doing so, the voltage of the bit line BL can be prevented from rising. Also, the voltage value of the capacitor C5 is checked so as to detect the polarized state of the ferroelectric capacitor CF.

Accordingly, with the ferroelectric memory of this embodiment, the electric charge in the ferroelectric capacitor CF is accurately read out, so that the data read-out operation can be performed with high precision and the reliability of the ferroelectric memory can be increased. Also, a rise of the voltage of the bit line BL is prevented so as to increase effectively the voltage across the ferroelectric capacitor CF. Thus, the operation voltage Vcc can be reduced.

In the ferroelectric memory of this embodiment, the potential of the bit line BL during a data read-out operation is uniform, so that an adverse influence from noise between bit lines BL can be reduced.

In the prior art, when the electric charge is read out from the memory cell, the potential of the bit line rises. With the rise of the potential of the bit line, the voltage supplied to the memory cell located between the plate line and the bit line becomes smaller, resulting in a smaller amount electric charge that can be read out. Therefore, the bit line capacitance is increased to prevent a big rise of the voltage in the bit line. However, an increase bit line capacitance reduces the voltage of the signal that can be read out.

In view of the above, to maintain a high voltage to be supplied to the memory cell and to enlarge the read-out signal, the ratio of the bit line capacitance to the cell capacitance needs to be optimized, resulting in complexity of design. In accordance with the present invention, a read-out method without a rise in the potential of the bit line is realized, thereby enabling desired setting of values for the bit line capacitance and the cell capacitance, depending on the design to be carried out.

The present invention is not limited to the specifically disclosed embodiments, but variations and modifications may be made without departing from the scope of the present invention.

The present application is based on Japanese priority application No. 2000-333160, filed on Oct. 31, 2000, the entire contents of which are hereby incorporated by reference.

What is claimed is:

1. A data storage comprising:
   a memory cell connected between a plate line and a bit line;
   a precharged circuit, connected to the bit line, for initializing a potential of the bit line to a first potential before reading data from the memory cell; and
   a potential holding unit for maintaining the potential of the bit line at the first potential so as to prevent a fluctuation of the potential of the bit line even when a second potential is supplied to the plate line.

2. A data storage device as claimed in claim 1, wherein the first potential is a ground potential and the second potential is a power source potential.

3. A data storage device as claimed in claim 1, wherein the potential holding unit includes a charge transfer unit for transferring an accumulated electric charge in the memory cell as the data to an amplifier unit as maintaining the potential of the bit line at the first potential.

4. A data storage device as claimed in claim 3, wherein the amplifier unit amplifies a voltage generated by the accumulated electric charge and reads out the data from the memory cell.

* * * * *